United States Patent [19]

Fournier

[11] Patent Number: 4,566,403
[45] Date of Patent: Jan. 28, 1986

[54] APPARATUS FOR MICROWAVE GLOW DISCHARGE DEPOSITION

[75] Inventor: Eugene Fournier, Garden City, Mich.

[73] Assignee: Sovonics Solar Systems, Solon, Ohio

[21] Appl. No.: 696,389

[22] Filed: Jan. 30, 1985

[51] Int. Cl.[4] ............................................. C23C 11/00
[52] U.S. Cl. ..................................... 118/718; 118/719
[58] Field of Search ................................. 118/718, 719

[56] References Cited

U.S. PATENT DOCUMENTS

| | | | |
|---|---|---|---|
| 4,226,898 | 10/1980 | Ovshinsky et al. | 427/39 |
| 4,265,730 | 5/1981 | Hirose et al. | 204/298 |
| 4,400,409 | 8/1983 | Izu et al. | 427/39 |
| 4,401,054 | 8/1983 | Matsuo et al. | 118/723 |
| 4,410,558 | 10/1983 | Izu et al. | 427/39 |
| 4,504,518 | 3/1985 | Ovshinsky et al. | 427/38 |
| 4,515,107 | 5/1985 | Fournier et al. | 118/718 |
| 4,517,223 | 5/1985 | Ovshinsky et al. | 427/39 |

*Primary Examiner*—James R. Hoffman
*Attorney, Agent, or Firm*—Jeffrey A. Wyand; Joseph G. Curatolo; Larry W. Evans

[57] ABSTRACT

Apparatus for microwave energized glow discharge deposition of materials, onto a substrate including electronic structures having a plurality of layers of amorphous semiconducting alloys of varying conductivity types. The apparatus includes at least one deposition chamber in which a novel antenna coupled to a source of microwave energy to form a microwave energy excited glow discharge plasma is disposed. The antenna has coaxial conductors approximately one half wavelength long that are electrically connected to each other at their respective distal ends. A multiple integer of one half wavelength of a coaxial transmission line coupling the antenna energy and source may also form part of the antenna. The respective outer conductors of the transmission line and antenna are separated by an electrically small gap, but the respective center conductors are electrically connected.

The apparatus may provide for continuous glow discharge deposition on a moving substrate web that passes through a number of deposition chambers for deposition of various layers to form a desired electronic device structure. Each chamber may include an antenna according to the invention.

21 Claims, 4 Drawing Figures

APPARATUS FOR MICROWAVE GLOW DISCHARGE DEPOSITION

FIELD OF THE INVENTION

This invention relates to apparatus for performing glow discharge processes at microwave frequencies, such as depositing amorphous semiconductor or other materials over relatively large areas. More particularly, the invention relates to antennas for use in such apparatus.

BACKGROUND

Recently efforts have been made to develop apparatus and methods for depositing materials over relatively large areas, such amorphous semiconductor alloys that can be doped to form p-type and n-type materials. These alloys can be used to produce p-n, p-i-n and other electronic device structures that are useful in photovoltaic and other applications.

Examples of such semiconductor alloy deposition efforts are described in U.S. Pat. Nos. 4,226,898 to Stanford R. Ovshinsky and Arun Madan, and 4,400,409, and 4,410,558, both to Masatsugu Izu, Vincent D. Cannella and Stanford R. Ovshinsky. These patents, incorporated herein by reference, disclose batch and continuous glow discharge deposition of amorphous semiconducting alloys containing compensating agents to reduce the concentration of localized states to a level acceptable for use in electronic devices. The deposited alloys may also contain bandgap adjusting elements and dopants.

As explained in the referenced patents to Izu et al., p-n and p-i-n structures can be deposited by passing a continuous substrate through a plurality of mutually isolated deposition chambers. Some of the chambers may contain selected dopant sources in addition to deposition sources so that doped and undoped layers may be sequentially deposited to prepare a desired electronic device structure. An important feature of these inventions is the ability to fabricate electronic devices continuously on a flexible substrate web that moves through the chambers during the deposition process. Such a flexible substrate may be paid out from one coil and taken up into another coil and may be hundreds of meters long and tens of centimeters wide. Therefore, a very large area of semiconducting material may be deposited in one passage of such a flexible substrate web through the deposition chambers.

The speed with which a web substrate may pass through a deposition chamber is limited, in one instance, by the rate at which material is deposited and the thickness of the layer required to be deposited in a particular chamber. As disclosed in the referenced patents, the glow discharge plasma in a deposition chamber may be initiated and sustained by radio frequency energy. It is known that glow discharge deposition rates may be increased by increasing the frequency of the energy supplied to the plasma to the microwave range, i.e. about 1000 MHz and up, corresponding to wavelengths shorter than about 0.3 meters. For an example, see U.S. Pat. No. 4,401,054 to Matsuo et al. The use of microwave energy also increases the efficiency of the deposition process, reduces the electron temperature in the glow discharge plasma and thereby reduces ion bombardment damage to the substrate and previously deposited layers of materials on the substrate.

However, use of microwave energy for plasma deposition over a large area, such as the width of the substrate web described above, creates a number of problems. For example, the wavelength of the microwave energy is of the same order of the magnitude as the web width so that standing waves may exist in a deposition chamber. These standing waves can produce non-uniform thicknesses in deposited layers across the width of a substrate. Therefore, use of microwave energy for glow deposition of materials has generally been confined to laboratory scale, small area depositions.

SUMMARY OF THE INVENTION

In the present invention apparatus is provided for glow discharge deposition of materials over a relatively large area. The apparatus includes an antenna for operation at microwave frequencies disposed in a deposition chamber, a source of microwave energy for energizing the antenna and a coupling means for coupling energy from the microwave source to the antenna. The antenna includes two linear coaxial conductors having a length of approximately one half the wavelength of the microwave energy. These conductors are short circuited at their distal ends, i.e., opposite the junction with the coupling means. In one embodiment of the invention the coaxial conductors are mutually separated by a gaseous dielectric and the coupling means is coaxial transmission line having a solid dielectric. The center conductors of the transmission line and antenna are electrically connected, but an electrically small, open gap is left between the outer conductor of the antenna and that of the transmission line. The dielectric of the transmission line may extend into the antenna to provide mechanical support. An additional half wavelength, or integer multiple of a half wavelength, of the transmission line may extend into the deposition chamber and act as part of the antenna.

The antenna launches a surface wave that sustains a glow discharge in a gas, such as silane, resulting in the deposition of a solid material, such as amorphous silicon. The antenna radiates a dipole-like pattern. When a half wavelength of the coupling transmission line forms part of the antenna, the radiation pattern is similar to that radiated by two dipole antennas connected end to end.

A dielectric tube, such as a quartz tube, having a closed end, is fit into the deposition chamber to receive the antenna. The tube mechanically isolates the antenna from the deposition process to prevent contamination of the deposition process by sputtering of the antenna elements. This tube may be fit within a second dielectric tube having a closed end sealed to the first tube to define a closed space. These tubes are preferably not concentric because of the non-uniform spacing of the tubes, the space within the second tube may be evacuated and/or backfilled with a gas to direct the radiation pattern of the antenna and, consequently, the glow discharge deposition process preferentially toward the substrate.

In an embodiment of the invention including a wavelength long antenna, the apparatus can produce a relatively uniform deposition over a wavelength wide substrate. The width of the plasma varies inversely with the gas pressure in the deposition chamber and gas pressures within the chamber and dielectric tubes of the antenna must be adjusted to produce the desired deposition width. Wider substrates may use longer half wavelength sections of transmission time, multiple antennas arranged end to end in a straight line or multiple staggered antennas to achieve the desired result. The apparatus may be used for batch processing or may include a means for continuously transporting a lengthy substrate web past the antenna. In the later case, the antenna is preferably oriented transversely to the direction of movement of the substrate web.

Other embodiments of the apparatus may also include a plurality of deposition chambers one or more of which includes the inventive antenna. For continuous deposition, each chamber includes a means for continuously introducing reaction gases that are decomposed in the glow discharge to effect the deposition and a means for exhausting spent and unused deposition gases.

DETAILED DESCRIPTION OF PREFERRED EMBODIMENTS

Figure 1:
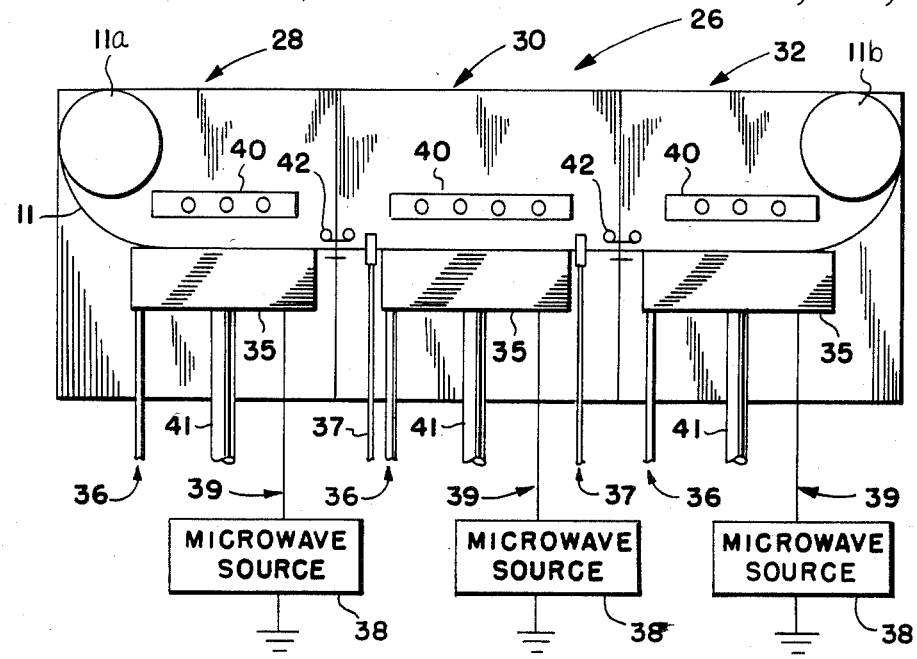
FIG. 1 is a schematic cross sectional representation of a multiple chamber glow discharge deposition apparatus for the continuous production of a three layer semiconductor device.

FIG. 1 is a schematic cross sectional representation of a preferred embodiment of a multiple chamber glow discharge deposition apparatus 26, for the continuous deposition of amorphous material electronic device structures. The present invention can also be applied to or incorporated in a batch processing deposition apparatus. The apparatus 26 includes three mutually isolated deposition chambers 28, 30 and 32 interconnected by gas gates 42 through which gases sweep and through which a web of substrate material 11 passes.

Apparatus 26 produces a large area of amorphous semiconductor material that may include a device structure, for example, a p-i-n configuration on the deposition surface of substrate material 11 that is continuously fed through the apparatus. To fabricate a p-i-n device, a p-type conductivity amorphous layer is deposited on substrate 11 as it passes through deposition chamber 28. In deposition chamber 30, an intrinsic amorphous layer is deposited on the p-type alloy layer as the substrate 11 passes through the chamber. In deposition chamber 32, an n-type conductivity layer is deposited atop the intrinsic layer as substrate 11 passes through. Although only three deposition chambers are illustrated, one or two chambers may be eliminated or additional individual chambers may be added to the apparatus to provide the capability of producing semiconductor devices having any number of layers of preselected conductivity types. A substrate supply coil 11a and a substrate take-up coil 11b are shown in deposition chambers 28 and 32 for illustrative purposes only. Those coils are preferably housed in separate chambers operatively connected to the deposition chambers. Substrate 11 is paid out from coil 11a and taken up by coil 11b during the continuous glow discharge deposition of material.

Within each of deposition chambers 28, 30 and 32, an amorphous layer, for example of a silicon alloy, is deposited on conductive substrate 11 or the previously deposited layer. Each deposition chamber includes a number of elements. Shield 35, described in more detail in connection with FIG. 2, directs the flow of gases within a chamber. A gas supply conduit 36 transmits deposition and doping gases to each chamber. Supply conduits 36 are operatively associated with their respective shields 35 to deliver process gas mixtures to the plasma regions created in each deposition chamber between shield 35 and substrate 11. A separate microwave energy source 38 connected to each chamber through its respective coupler 39 supplies the energy for maintaining the glow discharge in that chamber during the deposition process. It is preferred that the coupler be a transmission line matched in impedance to microwave source 38, such as conventional 50 ohm coaxial cable. Through outgassing conduit 41 spent and unused deposition and dopant gases are exhausted from each chamber to maintain the desired pressure in the chamber. An inert sweep gas conduit 37, disposed on opposed sides of deposition chamber 30, supplies a nonreactive gas to gas gates 42. A plurality of radiant heating elements 40 in each chamber are used to raise the temperature of substrate 11 to the desired point during glow discharge deposition. Gas gates 42 operatively connect the deposition chamber 30 to chambers 28 and 32 for continuous passage of substrate 11 and include an inert gas sweep supplied through conduit 37 for mutual isolation of the deposition and dopant gases in each chamber.

Figure 2:
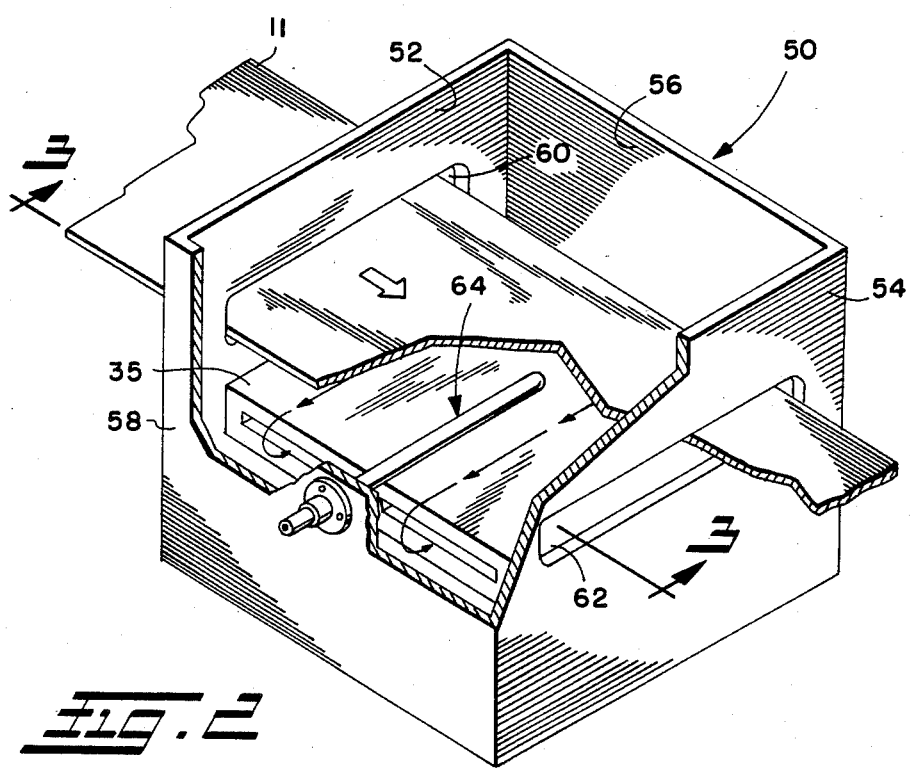
FIG. 2 is a perspective view, with portions broken away, of a glow discharge deposition chamber assembly embodying the invention.

Microwave energy generators 38, through their respective couplers 38, feed energy to antenna assemblies, 64, one of which is best seen in FIG. 2, extending into the plasma region in each of the deposition chambers, i.e., between shields 35 and substrate 11 which is electrically grounded. In that plasma region, the reaction gases are dissociated into deposition species. The deposition species are then deposited onto the surface of the substrate 11 as a layer of amorphous material.

In the invention, microwave energy generators 38 operate at a microwave frequency, for example, at 2.45 Gigahertz. During deposition, heaters 40 heat the substrate, typically to about 350° C. for deposition of amorphous silicon, and the chambers are maintained at a reduced pressure, preferably at about 0.1 Torr for glow discharge deposition from silane. Preferably, the reaction gases fed into gas supply conduits 36 include at least one semiconductor-containing compound such as silane ($SiH_4$) or silicon tetrafluoride ($SiF_4$) for silicon deposition. These gases can be used individually or can be combined and may have other gases such as hydrogen, fluorine and/or argon gas added to them. Deposited layers may be doped by adding suitable dopant gases through conduits 36, such as a boron-containing gas for p-type doping or a phosphorus-containing gas for n-type doping.

FIG. 2 shows a deposition chamber 50 for the microwave glow discharge deposition of a material onto substrate 11. Deposition chamber 50 generally illustrates the construction of chambers 28, 30 and 32 of FIG. 1. For clarity, heating elements 40 are not illustrated in FIG. 2. Chamber 50 generally includes opposed sidewalls 52 and 54, a backwall 56, and a front wall 58. Sidewalls 52 and 54 include slots 60 and 62, respectively, dimensioned to permit substrate web 11 to pass through the chamber as shown. Slots 60 and 62 are also dimensioned for coupling to gas gates 42 as previously referred to with respect to FIG. 1.

Shield 35 is disposed beneath substrate 11 and across the chamber between sidewalls 52 and 54. Antenna assembly 64 extends into the chamber 50 through the front wall 58 and between substrate 11 and shield 35. Shield 35 defines a flow pattern for the reaction gases across substrate 11 and between it and shield 35. The microwave energy radiated by antenna assembly causes a plasma to be formed and maintained in that region resulting in the deposition of an amorphous layer on the lower side of substrate 11. The unused or spent gases exit through outgassing conduit 41. This flow pattern is maintained by a pump, not shown, connected to outgassing conduit 41, shown in FIG. 1, that maintains the proper internal pressure in chamber 50 for and during the glow discharge deposition.

Figure 3:
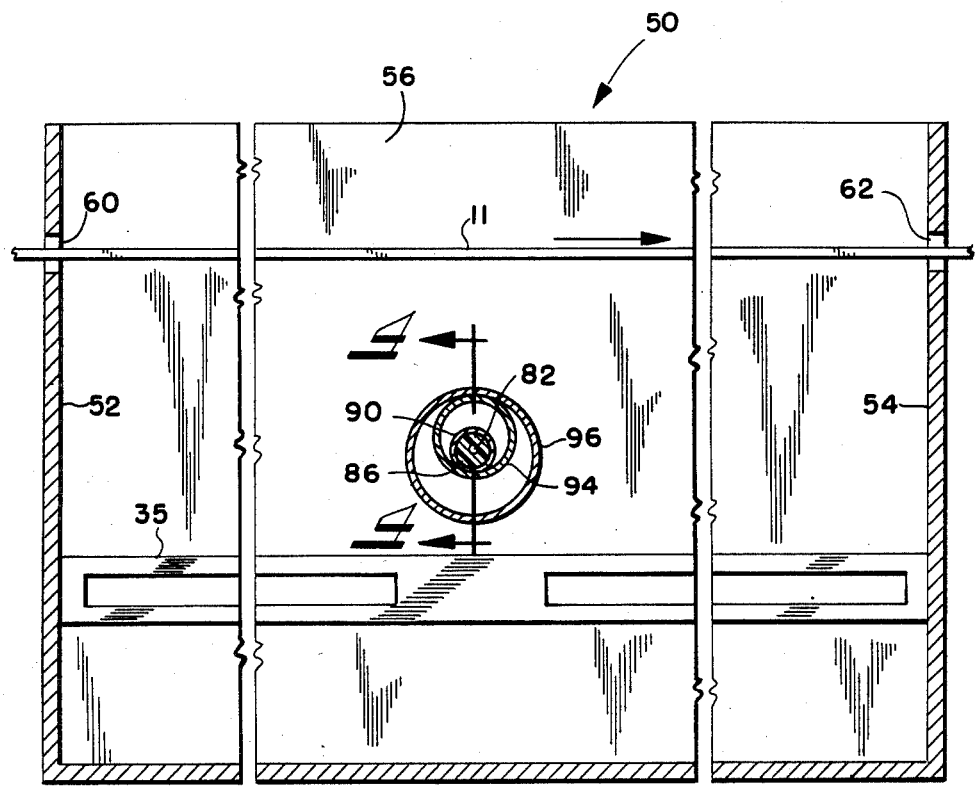
FIG. 3 is an end view of an antenna embodiment according to the invention taken along line 3—3 of FIG. 2.
Figure 4:
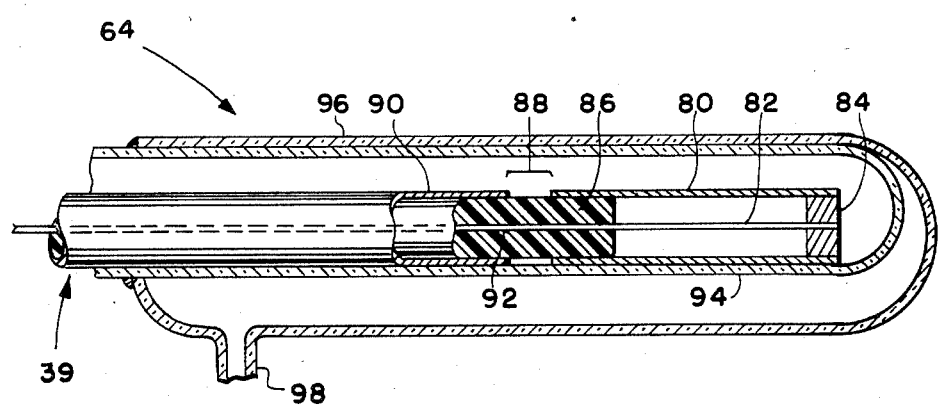
FIG. 4 is a cross sectional view of an antenna according to the invention taken along line 4—4 of FIG. 3.

FIGS. 3 and 4 illustrate in end and cross sectional views, respectively, a preferred embodiment of antenna assembly 64 according to the present invention. Antenna assembly 64 includes an outer conducting sheath 80 surrounding and coaxial with a center conductor 82. At the distal end of these coaxial conductors, i.e. at the end opposite the coupler 39, which is preferably a 50 ohm coaxial transmission line, a short circuit 84 electrically connects conductors 80 and 82. Short circuit 84 may be a metal plug that fits inside sheath 80 by friction and contains a hole to receive conductor 82 in a friction fit. Conductor 82 may be a stainless steel rod with a tapered end for fitting into short circuit 84. Sheath 80 has a length of approximately one half the wavelength of the microwave energy supplied to it. Throughout most of the length of sheath 80, the dielectric between it and center conductor 82 is air or some other gas. Coupler 39 is preferably a coaxial transmission line having a solid dielectric 86, such as a fluorocarbon polymer like those sold under the trademark Teflon, an outer conductor 90 and an inner conductor 92. Fifty ohm transmission lines are available in a number of diameters. Transmission line 39 has been selected to be comparable in diameter to sheath 80. Line 39 has been modified by removing a length of its outer conductor leaving a length of dielectric 86 projecting from it. The projecting dielectric is inserted into sheath 80 to provide mechanical support to the sheath and its center conductor 82. Preferably, the diameters of sheath 80 and line 39 are chosen to provide a snug fit between the sheath and projecting dielectric. A gap 88 exists between outer conductor 90 of transmission line 39 and sheath 80, so that those conductors are electrically open and opposed across the outer surface of dielectric 86. Gap 88 is dimensioned to be electrically small. That is, the width of gap 88 is made much smaller than a wavelength of the microwave energy that is used to energize the plasma. At 2.45 GHz, where the wavelength is approximately 12 cm, the width of gap 88 should not exceed about 3 cm. and preferably is about 0.3 cm. Unlike the outer conductors, inner conductor 92 of transmission line 39 is electrically connected to center conductor 82. I have found that if a multiple integer of a one half wavelength long length of coaxial transmission line 39 is inserted into the deposition chamber along with the one half wavelength length of the sheath 80, a surface wave is launched from the antenna assembly. I prefer that the integer be one, that is, that the inserted length of coaxial cable be one half wavelength.

Antenna assembly 64 is preferably contained within chamber 50 in a dielectric tube 94, such as a glass or quartz tube that has its distal end sealed. This tube prevents the glow discharge plasma from stripping off atoms from the antenna elements that may contaminate the layer being deposited in chamber 50. Outside chamber 50 tube 94 is open to the atmosphere and is preferably maintained at atmospheric pressure. The size of the glow discharge in chamber 50 depends inversely on the gas pressure in the chamber. I prefer that tube 94 be about 19 mm in diameter. If tube 94 is too small, the size of the plasma cannot be adjusted by changing chamber pressure to obtain the desired plasma width.

In addition, I have found it useful, as further explained below, to envelope tube 94 in an atmosphere that can be controlled in content and pressure. This ambient control is achieved by enclosing tube 94 in another dielectric tube 96, also preferably quartz, that is closed at its distal end and sealed to tube 94 at its proximate end as best seen in FIG. 4. Tube 96 includes an inlet 98, through which the volume between tubes 94 and 96 can be evacuated and backfilled, as desired, with a selected, preferably noble, gas to influence the direction of deposition. As indicated in FIG. 2, tube 96 enters chamber 50 through a vacuum fitting 100, which may be a conventional fitting. When tube 94 is used alone, it is sealed to fitting 100.

The cross sectional end view in FIG. 3 of antenna assembly 64 shows a preferred embodiment in which the directionality of the plasma and consequent deposition is controlled. As is preferred, substrate 11 is above antenna assembly 64 so that deposition takes place in an "upward" direction. As shown in FIGS. 3 and 4, tubes 94 and 96 are not concentric. Tube 94 is offset from the center of tube 96 and, as shown in FIG. 4, may be maintained in contact with tube 96 by being fused to it. In one embodiment, tube 96 was a quartz tube about 1.9 cm in diameter, evacuated and backfilled with argon through inlet 98. The antenna was inserted into smaller tube 94, which was about 0.95 cm in diameter. The interior of tube 94 was maintained at atmospheric pressure. The argon-filled space between tubes 94 and 96 was maintained at the same gas pressure as was chamber 50. A plasma was ignited with a chamber pressure of 0.05 to 0.2 Torr. The plasma appeared both inside and outside the tube 96, but coupling of the plasma with the substrate resulted in preferred directional deposition on the substrate. That is, the argon apparently loaded the antenna and decreased its electromagnetic coupling in the direction opposite substrate 11. Some material was deposited on the back side of the tube 96 with the directional structure shown, but a great deal less material was deposited on the back of the tube than was deposited on substrate 11. The length of the plasma varied with the pressure and kind of gas present in the plasma region. A plasma length about 7.5 cm was observed with only silane present in the chamber, but the plasma spread to twice that length when only argon was present. Tuning of the plasma for spread over the full width of the substrate is done experimentally by adjusting the gas pressures.

Embodiments of the inventive apparatus and antenna have been successfully operated both on a batch basis and with a moving substrate web. As shown in FIG. 2, the inventive antenna assembly is preferably disposed transversely to the direction of movement of substrate web 11. If the web is wider than about one wavelength, several of the inventive antennas may be used in an end to end configuration at the same location or in staggered locations across the substrate web to obtain deposition over the full width of the web.

At 2.45 GHz, a very uniform looking plasma approximately 14 cm wide yielding a deposition rate of about 50 angstroms per second was observed. The deposited material had a relatively uniform thickness over a wavelength width of substrate. Coupler 39 was a 50 ohm coaxial transmission line having copper inner and outer conductors, and a Teflon dielectric. Gap 88 was about 0.25 cm wide. Both sheath 80 and center conductor 82 were formed from stainless steel tubing with a steel plug as short circuit 84, the former being about 0.6 cm in diameter. A metallic substrate web 11 maintained at about 300° C. was spaced about 5 cm from antenna 64. Substrate 11 and antenna 84 must be sufficiently separated, preferably between about 1.9 and 5 cm depending on the pressure in chamber 50, to avoid difficulty in igniting and maintaining the plasma in chamber 50. The antenna assembly operated successfully with deposition pressures of 0.16 to 0.2 Torr, silane flow rates of 10 to 20 sccm, an argon flow rate of 100 sccm and hydrogen flow rates of 20 to 50 sccm. Input power was maintained at about 100 to 120 watts, although the antenna was not perfectly matched to the energy source 38 and some power was reflected. As noted, I found that the impedance match or mismatch of the antenna to its energy source is affected by the content and pressure of the gas in chamber 50 and in the space between tubes 94 and 96.

The invention has been described with respect to certain preferred embodiments. Various modifications and additions within the spirit of the invention will occur to one of ordinary skill in the art. Therefore, the scope of the invention is limited solely by the following claims.

I claim:

1. Apparatus for depositing a material onto a substrate from a microwave energy excited plasma, said apparatus comprising:
    a deposition chamber;
    microwave energy source means for producing radio frequency energy at a microwave wavelength;
    a microwave antenna disposed within said chamber;
    coupling means for coupling energy from said microwave energy source means to said antenna, wherein said antenna includes a conducting sheath approximately one half said wavelength long and an inner conductor coaxially disposed within said sheath, and means for electrically connecting said sheath and inner conductor at their respective distal ends.

2. The apparatus of claim 1 wherein said coupling means comprises a transmission line having coaxial inside and outside conductors separated by a solid dielectric, said inner and inside conductors are electrically connected and said sheath and outside conductor are disposed in opposing, electrically open relation.

3. The apparatus of claim 2 wherein said opposed sheath and outside conductor are separated by a distance less than one-quarter of said wavelength.

4. The apparatus of claim 3 wherein said antenna includes a length of said transmission line approximately an integer multiple of one half said wavelength long.

5. The apparatus of claim 2 wherein said solid dielectric projects from said transmission line and into said sheath.

6. The apparatus of claim 5 further including a first dielectric tube having a closed end extending into said chamber, said antenna being disposed within said first tube.

7. The apparatus of claim 6 including a second dielectric tube having a closed end extending into said chamber and receiving said first tube in sealing relationship, said second tube including inlet means for selectively evacuating and pressurizing said second tube.

8. The apparatus of claim 7 wherein said first tube is offset within said second tube toward said substrate.

9. The apparatus of claim 1 further including a first dielectric tube having a closed end extending into said chamber, said antenna being disposed within said first tube.

10. The apparatus of claim 9 including a second dielectric tube having a closed end extending into said chamber and receiving said first tube in sealing relationship, said second tube including inlet means for selectively evacuating and pressurizing said second tube.

11. The apparatus of claim 10 wherein said first tube is offset within said second tube toward said substrate.

12. An apparatus for manufacturing photovoltaic devices of the type including a plurality of layers of semiconductor material deposited onto a substrate, said apparatus comprising:
    a plurality of deposition chambers, each said chamber arranged to deposit a respective one of said layers of semiconductor materials onto a substrate;
    microwave energy source means for producing radio frequency energy at a microwave wavelength;
    a microwave antenna disposed in at least one of said deposition chambers, said antenna including a conducting sheath approximately one half said wavelength long and an inner conductor coaxially disposed within said sheath, and means for electrically connecting said sheath and inner conductor at their respective distal ends;
    coupling means for coupling energy from said microwave energy source to said antenna; and
    means for introducing reaction gases including at least one semiconductor containing compound into said at least one deposition chamber for depositing a layer of semiconductor material onto said substrate.

13. The apparatus of claim 12 wherein said coupling means comprises a transmission line having coaxial inside and outside conductors separated by a solid dielectric, said inner and inside conductors are electrically connected and said sheath and outside conductor are disposed in opposing, electrically open relation.

14. The apparatus of claim 13 wherein said opposed sheath and outside conductor are separated by a distance less than one-quarter of said wavelength.

15. The apparatus of claim 14 wherein said antenna includes a length of said transmission line approximately an integer multiple of one half said wavelength long.

16. The apparatus of claim 12 further including a source of substrate material and means for continuously advancing said substrate material through said deposition chambers and wherein said sheath is disposed transversely to the direction of said continuous advance of said substrate.

17. The apparatus of claim 13 wherein said solid dielectric projects from said transmission line and into said sheath.

18. The apparatus of claim 12 including a first dielectric tube having a closed end extending into said chamber, said antenna being disposed within said first tube.

19. The apparatus of claim 17 including a second dielectric tube having a closed end extending into said chamber and receiving said first tube in sealing relationship, said second tube including inlet means for selectively evacuating and pressurizing said second tube.

20. The apparatus of claim 18 wherein said first tube is offset within said second tube toward said substrate.

21. An apparatus as defined in claim 12 further including a said microwave energy source means for each of said deposition chambers, a microwave antenna in each of said deposition chambers, coupling means for coupling energy from each of said respective energy sources to each of said respective antennas and means for introducing reaction gases including at least one semiconductor containing compound into each said deposition chamber for depositing a layer of semiconductor material onto said substrate.

* * * * *